(12) United States Patent
Chen et al.

(10) Patent No.: US 10,064,299 B2
(45) Date of Patent: Aug. 28, 2018

(54) COMPONENT QUICK RELEASE

(71) Applicant: Quanta Computer Inc., Taoyuan (TW)

(72) Inventors: Chao-Jung Chen, Taoyuan (TW);
Yaw-Tzorng Tsorng, Taoyuan (TW);
Chun Chang, Taoyuan (TW);
Cheng-Chieh Weng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 241 days.

(21) Appl. No.: 14/983,810

(22) Filed: Dec. 30, 2015

(65) Prior Publication Data
US 2017/0196107 A1    Jul. 6, 2017

(51) Int. Cl.
| | |
|---|---|
| *F16M 11/00* | (2006.01) |
| *H05K 5/02* | (2006.01) |
| *F16M 13/02* | (2006.01) |
| *H05K 7/14* | (2006.01) |
| *H05K 7/16* | (2006.01) |
| *G06F 1/18* | (2006.01) |

(52) U.S. Cl.
CPC ......... *H05K 5/0295* (2013.01); *F16M 13/022* (2013.01); *G06F 1/18* (2013.01); *H05K 7/1401* (2013.01); *H05K 7/1417* (2013.01); *H05K 7/16* (2013.01)

(58) Field of Classification Search
CPC .......................... H05K 13/021; H05K 5/0295
See application file for complete search history.

(56) References Cited

U.S. PATENT DOCUMENTS

| | | | | |
|---|---|---|---|---|
| 2012/0218705 A1* | 8/2012 | Huang | .................. | G06F 1/187 361/679.37 |
| 2016/0120056 A1* | 4/2016 | Kuang | ................. | H05K 7/1409 403/322.4 |

* cited by examiner

*Primary Examiner* — Amy Jo Sterling
(74) *Attorney, Agent, or Firm* — Nixon Peabody LLP; Eduardo J. Quiñones

(57) ABSTRACT

An assembly bracket coupled to a component for locking and releasing the component with a latch of a component receiving module on a component board. The assembly bracket having a rotary hinge connected to a support bracket, a handle rotatable about the rotary hinge between a retracted position and a deployed position, a linkage rotatably coupled to the handle, and a support lever coupled to the linkage and having an engagement member to engage the latch. When the handle is in the retracted position, the engagement member is engaged with the latch, thereby securing the component in the component receiving module. When the handle transitions from the retracted position to the deployed position, the support lever applies a force away from the component receiving module to thereby decouple the component from the component receiving module.

16 Claims, 11 Drawing Sheets

COMPONENT QUICK RELEASE

FIELD

The subject matter herein generally relates to a component assembly bracket. More specifically, the subject matter herein relates to a component assembly bracket configured to assist in installation and removal of a component from a component receiving module.

BACKGROUND

Electronic devices rely on components coupled to component receiving modules to operate. These components include hard drives, data cards, Ethernet cards, fans, video cards, or the like. These components fail and/or require replacement during the life of the electronic device. The coupling and decoupling of the component from the component receiving module often requires a significant separation force often in a confined or tight environment. This significant separate force can damage to the component during decoupling or cause injury to a technician.

BRIEF DESCRIPTION OF THE DRAWINGS

Implementations of the present technology will now be described, by way of example only, with reference to the attached figures, wherein.

DETAILED DESCRIPTION

Figure 1:
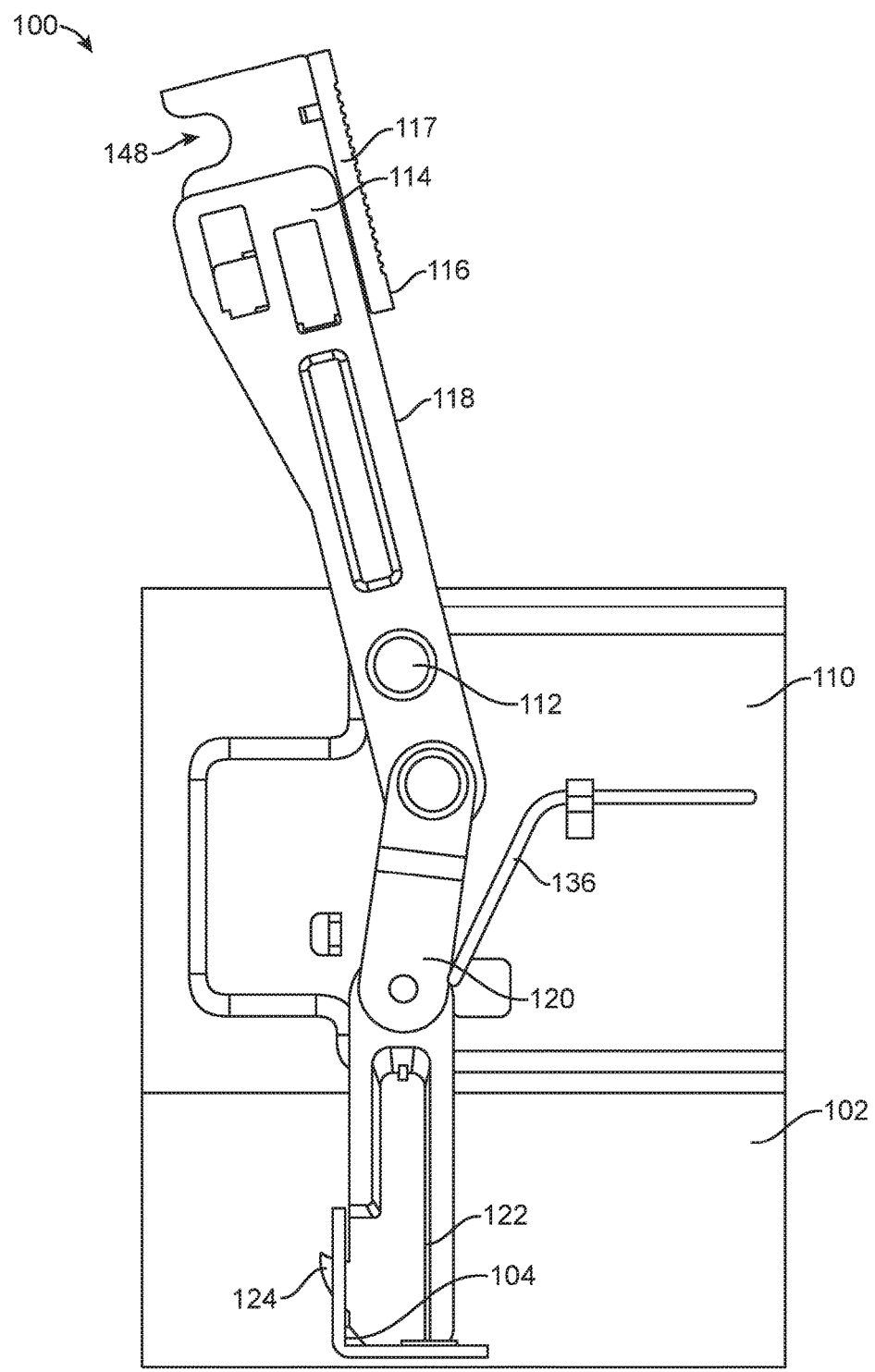
FIG. 1 is a partial side elevational view of an example embodiment of an assembly bracket in a partially deployed position.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Electronic devices have become common place in everyday life, and electronic devices rely on components coupled to component receiving modules. As those components need to be replaced, decoupling the component from the component receiving module often requires significant force in a compact environment.

The present disclosure is focused on increasing the ease of removing and installing components within component receiving modules of electronic devices. Electronic devices have a plurality of components coupled to component receiving modules. Each component can be coupled to an assembly bracket for locking and releasing the component with a latch of a component receiving module. The assembly bracket includes a rotary hinge connected to support bracket, a handle rotatable about the rotary hinge between a retracted position and a deployed position, and a linkage coupled to the handle. A support lever is coupled to the linkage and has an engagement member to engage the latch. When the handle is in the retracted position, the engagement member is engaged with the latch, thus securing the component in the component receiving module. When the handle transitions from the retracted position to the deployed position, the support lever applies a decoupling force away from the component receiving module to decouple the component from the component receiving module. The component can be a Peripheral Component Interconnect Express (PCI-e) card received in a PCI-e interface of an electronic device. The electronic device can be a server, computer, laptop, or other electronic device. While the exemplary embodiments illustrated herein utilizes a PCI-e card and interface, the present disclosure relates to any component interface, such as Peripheral Component Interconnect (PCI), ExpressCard, Serial AT Attachment (SATA) Express and receive any component such as network cards, fans, motherboards, processors, memory cards, or other electronic device components and their respective interface.

FIG. 1 illustrates a partial side view of an example embodiment of an assembly bracket in a partially deployed position. The assembly bracket 100 is coupled to a component 102 for locking and releasing the component 102 with a latch 104. The assembly bracket 100 has a support bracket 110 coupled to the component 102. A handle 114 is rotatably mounted to the support bracket 110 by a rotary hinge 112. The handle 114 is rotatable between a retracted position 500 (shown in FIG. 4) and a fully deployed position (shown in FIG. 2). A linkage 120 rotatably couples the handle 114 with a support lever 122. The support lever 122 has an engagement member 124 to engage the latch 104. In at least one embodiment, the support lever 122 is biased in a single direction by a guide spring 136.

Figure 4:
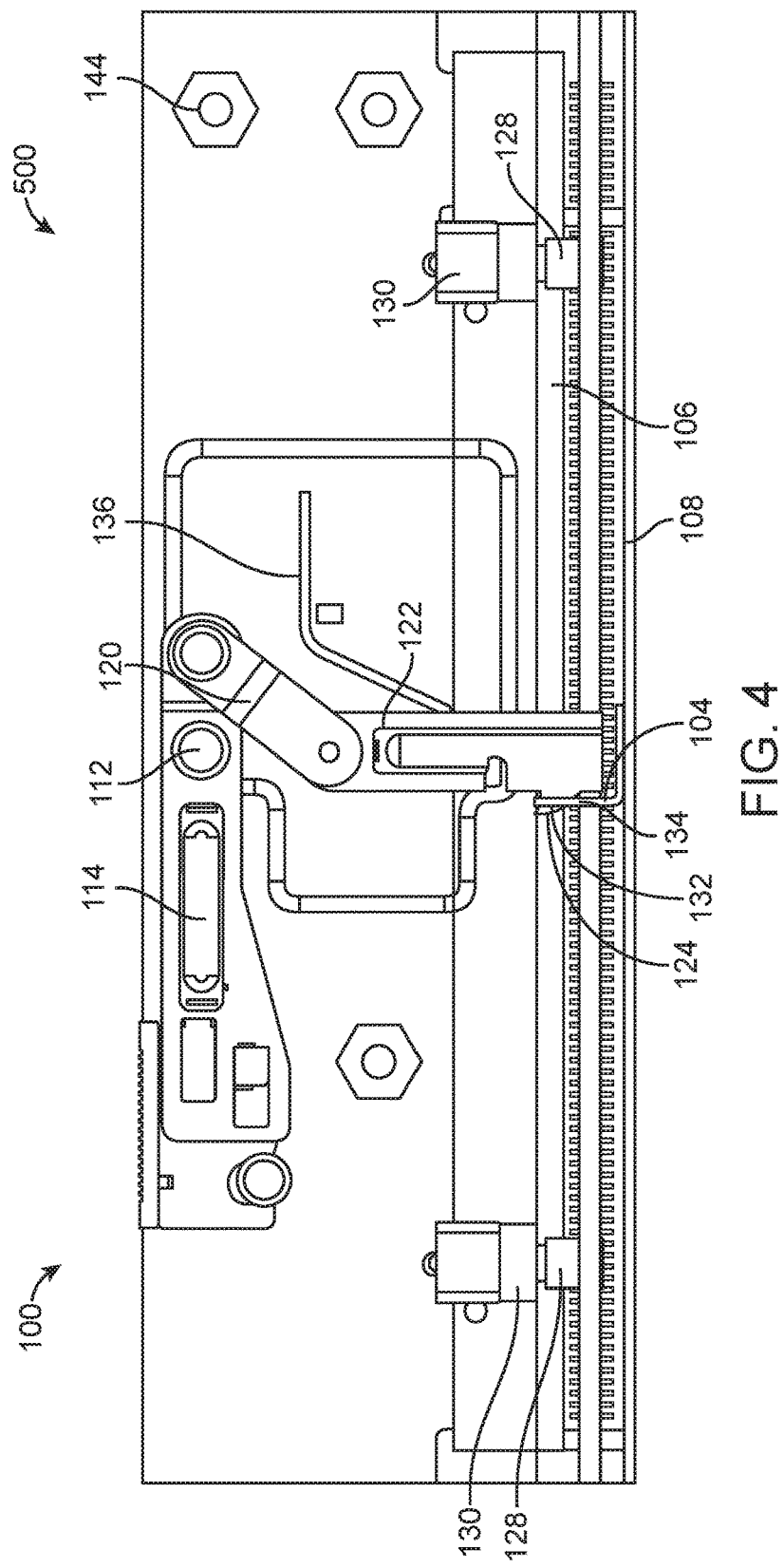
FIG. 4 is a front elevational view of an example embodiment of an assembly bracket in a retracted position coupled to a component.

Referring now to FIG. 4, when the handle 114 is in the retracted position, the engagement member 124 is engaged with the latch 104 to secure the component 102 in a component receiving module 106. (Shown in FIG. 4).

As the handle 114 transitions from the retracted position to the fully deployed position, the support lever 122 applies a force away from the component receiving module 106 to decouple the component 102 from the component receiving module 106 in a manner described herein.

As can be appreciated in FIG. 1, the handle 114, linkage 120, and support lever 122 are substantially linear bars coupled one to the other, forming a mechanical linkage. The handle 114 has a gripping portion 116 and an actuation portion 118. The gripping portion 116 has a textured surface 117 to improve usability. In at least one embodiment, the gripping portion 116 can also be translatable along a longitudinal axis of the handle 114.

Figure 2:
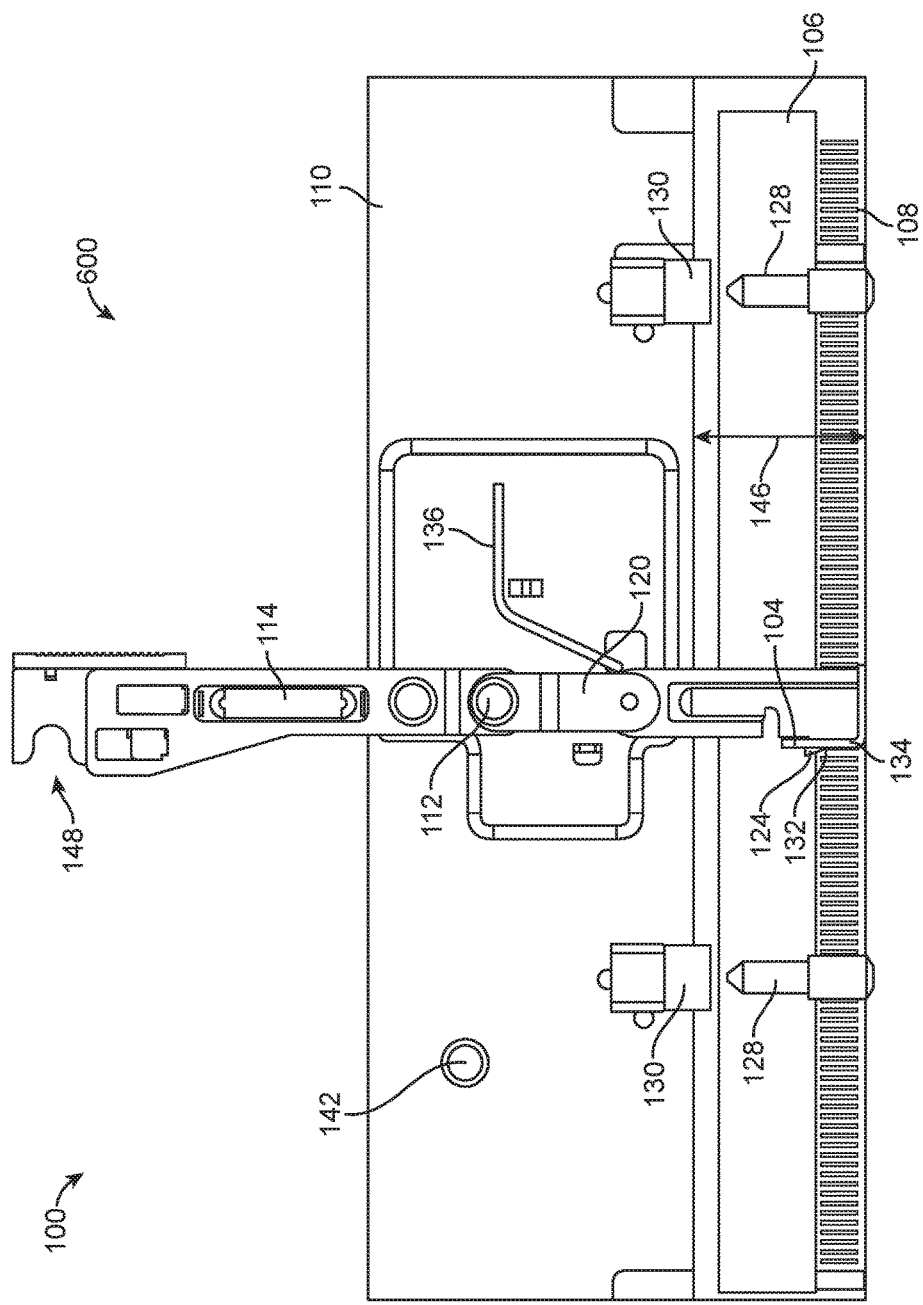
FIG. 2 is a front elevational view of an example embodiment of an assembly bracket in a deployed position coupled to a component.
Figure 3:
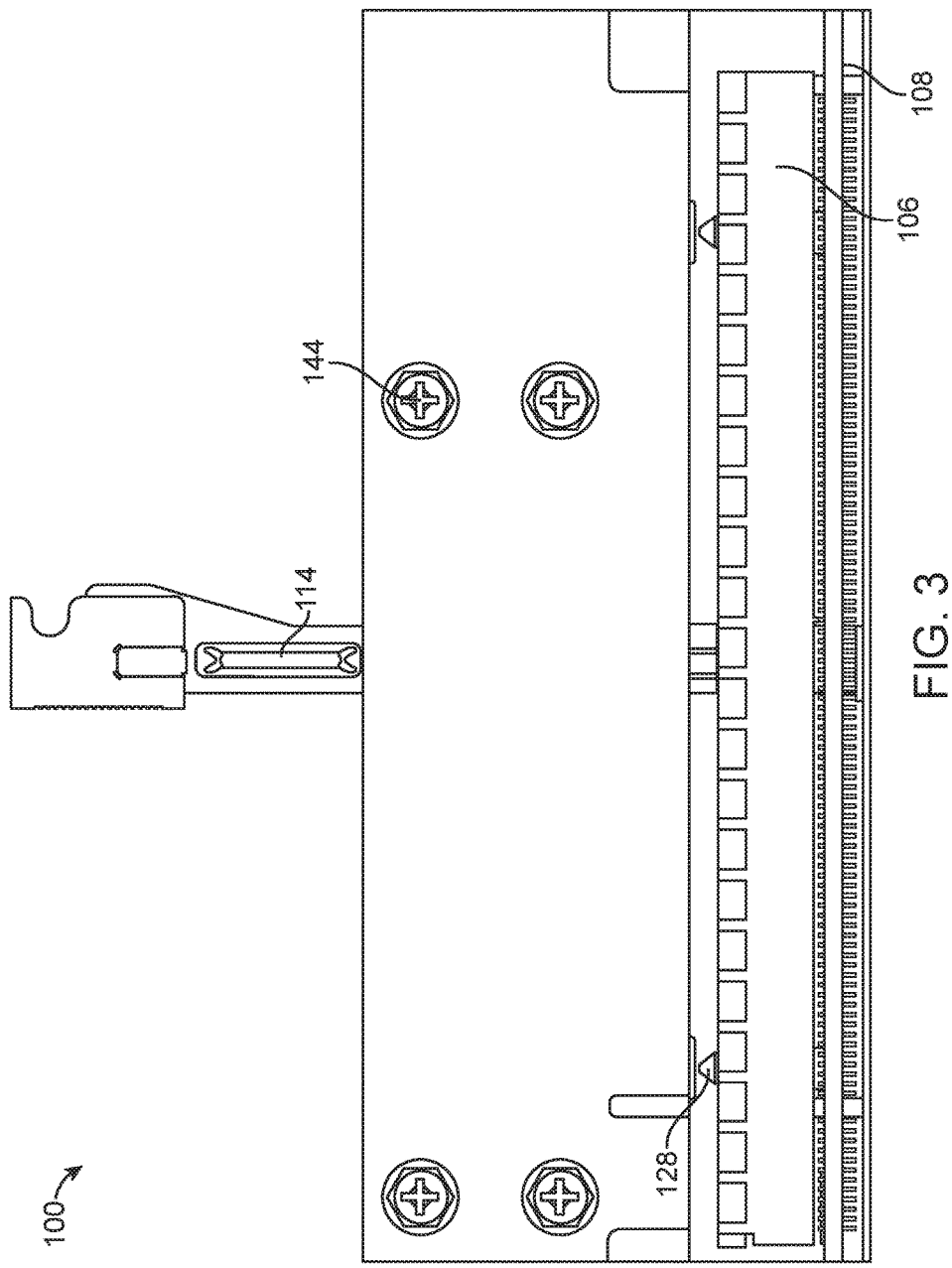
FIG. 3 is a back side elevational view of an example embodiment of an assembly bracket in a deployed position coupled to a component.

FIG. 2 illustrates a front side view of an example embodiment of an assembly bracket in a deployed configuration coupled to a component. FIG. 3 illustrates a back side view of an example embodiment of an assembly bracket in a deployed configuration coupled to a component. As can be appreciated in FIG. 2, the support bracket 110 has a profile substantially equal to that of the component 102 and substantially covering the entire front surface of the component 102. In other embodiments, the support bracket 110 can be bigger or smaller than the component 102 depending on the configuration of the component 102 and the component receiving module 106.

The support bracket 110 has a securing pin 142 disposed on the front surface of the handle 114. The securing pin 142 is received in a pin receiving portion 148 of the handle 114, thus securing the handle 114 in the withdrawn position. The securing pin 142 prevents the handle 114 from rotating beyond the withdrawn position causing too much pressure on the latch 104 and the component receiving module 106. In at least one embodiment, the gripping portion 116 can be translatable relative to the handle 114. Translation of the gripping portion 116 capable of coupling and releasing the handle 114 from the securing pin 142.

The assembly bracket 100 can align the component 102 with the component receiving module 106. The component board 108 can have at least one guide pin 128 capable of being received within at least one guide pin receiver 130 of the assembly bracket 100. During coupling of the component 102 with the component receiving module 106, the at least one guide pin 128 is received within the at least one guide pin receiver 130, thereby aligning the component 102 with the component receiving module 106. In other embodiments, the component 102 and the component receiving module 106 can have guide slots, guide connectors, or other similar guide arrangements known in the art.

As can further be appreciated in FIG. 2, the component board 108 has two guide pins 128 coupled thereto and the assembly bracket 100 has two guide pin receivers 130 spaced apart on the front side of the assembly bracket 100. The two guide pin receivers 130 receive two guide pins 128 coupled to the component board 108. The two guide pins 128 and two guide pin receivers 130 are equally spaced along the length of the assembly bracket 100. While two guide pins 128 and two guide pin receivers 130 are illustrated in FIG. 2, more or less guide pins 128 and guide pin receivers 130 can be implemented to align the component 102 with the component receiving module 106. In other embodiments, the at least one guide pin 128 can be disposed on the assembly bracket 100 and the at least one guide pin receiver 130 can be disposed on the component board 108. In yet other embodiments, the at least one guide pin 128 or the at least one guide pin receiver 130 can be disposed on the component receiving module 106.

The support bracket 110 is coupled to the component using one or more fasteners 144. The fasteners 144 can be screws, snap connectors, adhesive, rivets, or any fastener known in the art. The one or more fasteners 144 are positioned on the component 102 so as to not interfere with operation of the assembly bracket 100. As can be appreciated in FIG. 3, the support bracket 110 is coupled to the component 102 by four screws fasteners 144 from the back side of the component 102. The four screw fasteners 144 are arranged in a substantially rectangular pattern. In other embodiments, the fasteners 144 can be arranged in other patterns, shapes, or with no pattern or shape. The fasteners 144 are shown from the back side of the component 102 and not visible on the assembly bracket 100. As can be appreciated in FIGS. 4 and 6, the fasteners 144 can extend through the assembly bracket 100 to the back side of the component 102.

FIG. 4 illustrates a front elevational view of an example embodiment of an assembly bracket in a retracted position. In the retracted position, the component 102 can be coupled to the component receiving module 106. The handle 114 is substantially parallel to the component receiving module 106 and does not extended beyond the perimeter of the support bracket 110. The engagement member 124 is engaged with the latch 104 securing the component 102 in the component receiving module 106. In at least one embodiment, the engagement member 124 is a protrusion 132 extending from the support lever 122 to engage the latch 104. As can be appreciated in FIG. 4, the protrusion 132 is a hook to engage a substantially loop shaped 134 of the latch 104. The substantially loop shape 134 can be a substantially upside down U-shape configured to receive the hook 132 of the support lever 122. In other embodiments, the latch 104 can have a complete or partial loop in the shape of a circle, rectangle, triangle, or any other polygonal shape.

Figure 5:
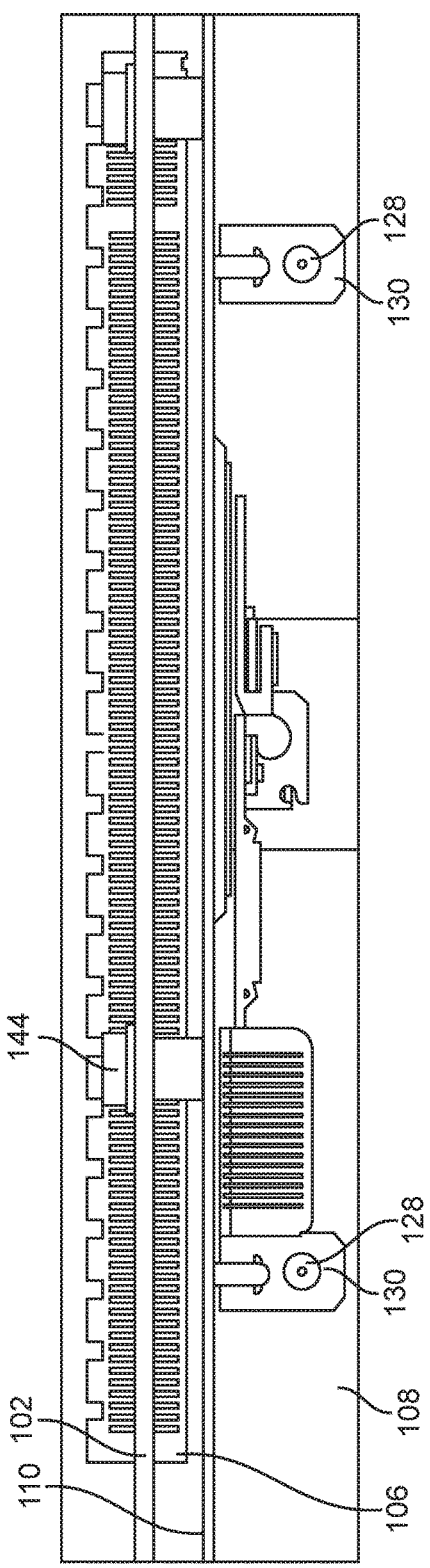
FIG. 5 is top plan view of an example embodiment of an assembly bracket in a retracted position coupled to a component.

FIG. 5 illustrates a top plan view of an example embodiment of an assembly bracket in a retracted position. As can be appreciated in FIG. 5, the component 102 coupled to the assembly bracket 100 is aligned with the component receiving module 106 by two guide pins 128 received in two guide pin receivers 130. The support bracket 110 is coupled to the component 102 with fasteners 144. The fasteners 144 protrude through each side of the component 102, and through the front surface of the support bracket 110. In other embodiments, the fasteners 144 can extend through both surfaces of the component 102 and both surfaces of the support bracket 110, such that they are visible on the front surface of the support bracket 110. (See FIG. 6).

Figure 6:
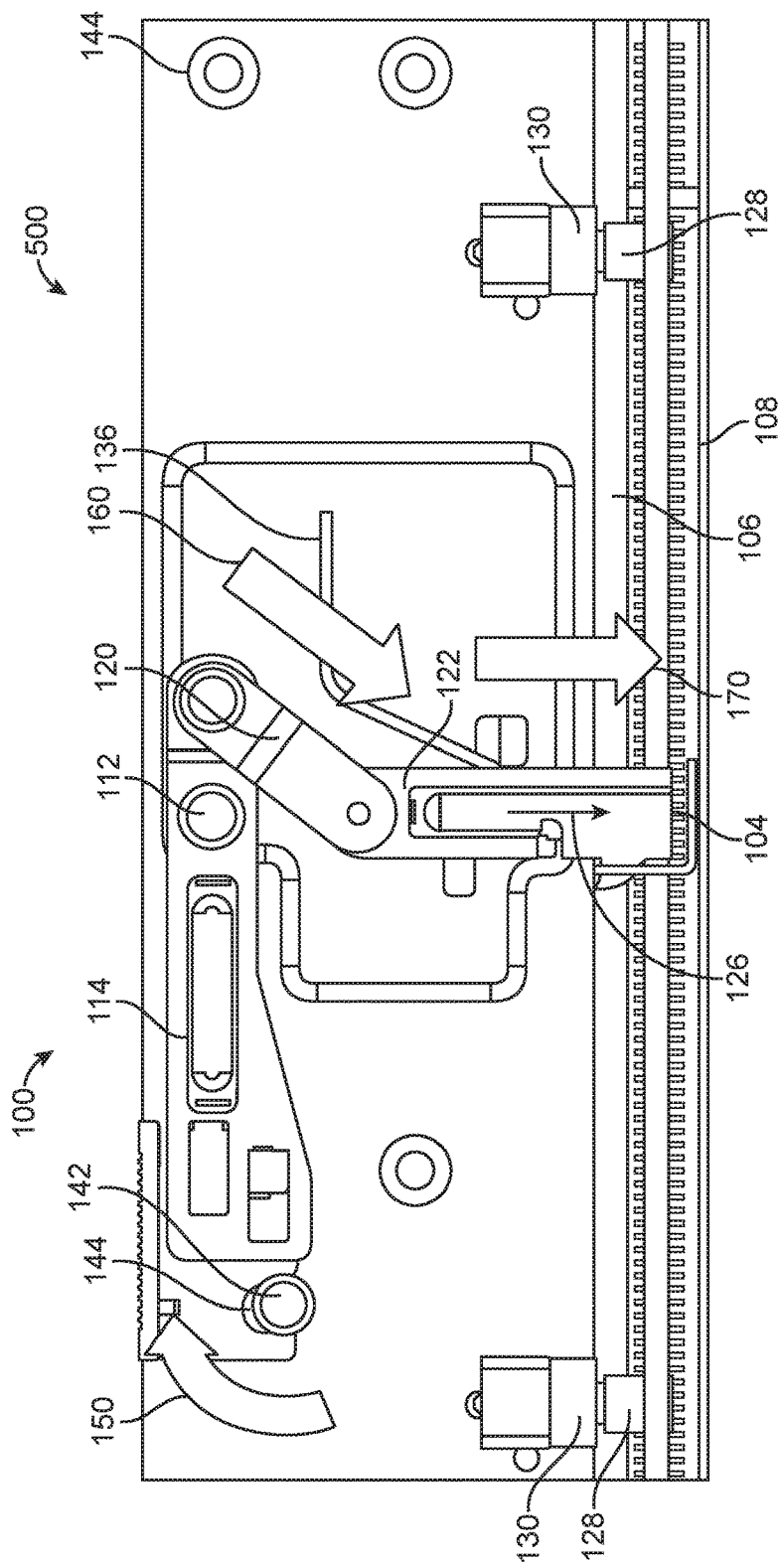
FIG. 6 is a front elevational view of an example embodiment of an assembly bracket in a retracted position coupled to a component.
Figure 7:
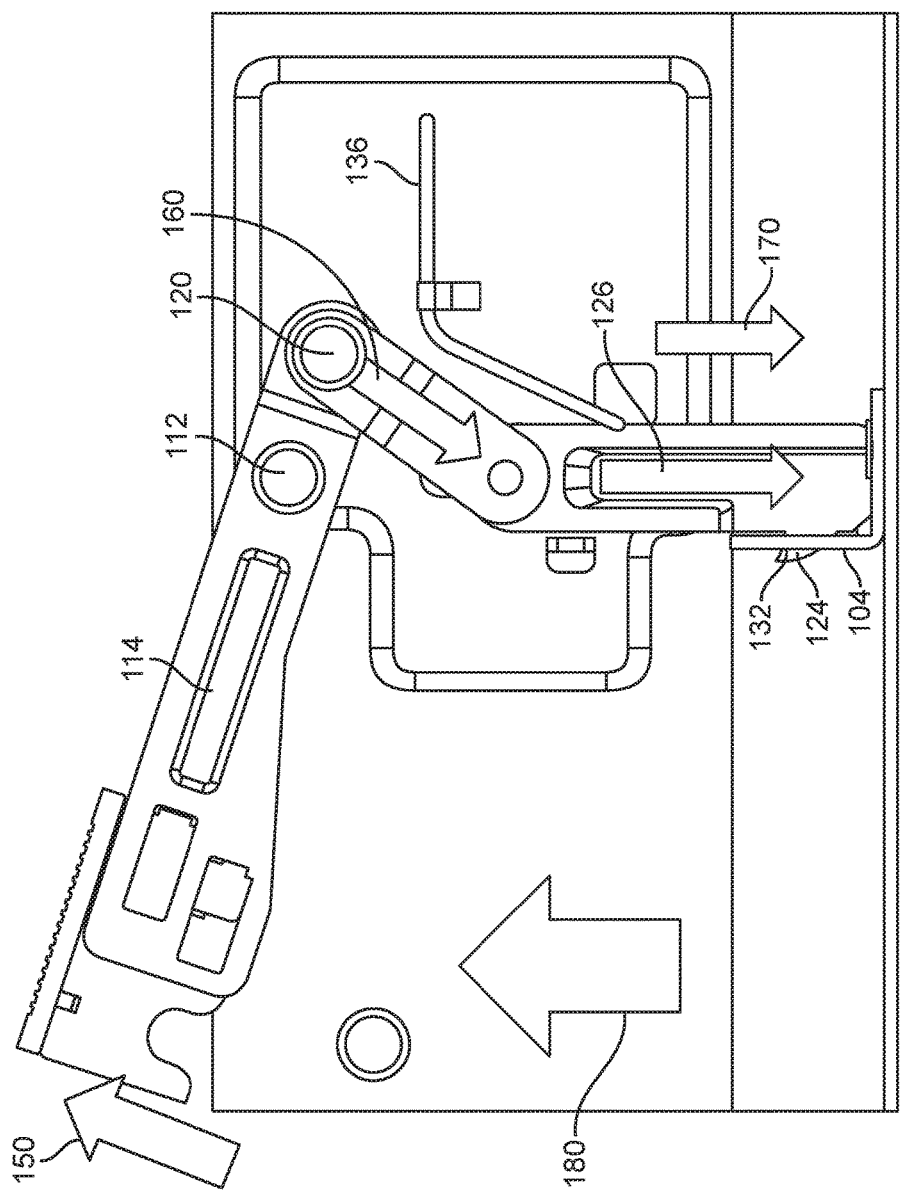
FIG. 7 is a partial side elevational view of an example embodiment of an assembly bracket in a partially retracted position.

FIG. 6 illustrates a front elevational view of an example embodiment of an assembly bracket in a retracted position with arrows to show the direction of movement of the component parts when the handle 114 moves from the retracted position in FIG. 6 to the partially deployed position in FIG. 7

The handle 114 is rotatable about the rotary hinge 112 between the retracted position and the fully deployed position. The handle 114 is coupled to the linkage 120 at an end opposite the gripping portion 116. Rotation of the handle 114 in a first decoupling direction 150 causes the linkage 120 to be displaced in a second decoupling direction 160. Displacement of the linkage 120 in the second decoupling direction 160 displaces the support lever 122 in a third decoupling direction 170. The support lever 122 is supported by a guide spring 136 to bias movement of the support lever 122 along a single axis. Displacement of the support lever 122 generates a decoupling force 126 away from the component receiving module 106 decoupling the component 102 from the component receiving module 106. Decoupling of the component 102 from the component receiving module 106 moves the component 102 in a fourth decoupling direction 180 substantially opposite the third decoupling direction 170. The support lever 122 is displaced and generates decoupling force 126 against the latch 104, the component receiving module 106, or the component board 108.

In at least one embodiment, the latch 104 can have a substantially flat surface below the support lever 122 to absorb the decoupling force 126. In other embodiments, the component board 108 can have a reinforced portion to absorb the force 126. In yet other embodiments, the component module 106 can have a reinforced portion to absorb the force 126.

The guide spring 136 ensures the support lever 122 translates substantially perpendicular to the component receiving module 106. The guide pins 128 further ensures the component 102 couples and decouples from the component receiving module 106 properly, thus preventing damage to the component 102. The guide pins 128 and guide spring 136 collectively ensure the decoupling force 126 decouples the component 102 from the component receiving module 106 without deflection of the component 102. In at least one embodiment, the handle 114 can be rotatable about rotary hinge 112 in a clockwise direction between the retracted position and the fully deployed position. In other embodiments, the handle 114 can be rotatable about rotary hinge 112 in a counter-clockwise direction between the retracted position and the fully deployed position.

Figure 8:
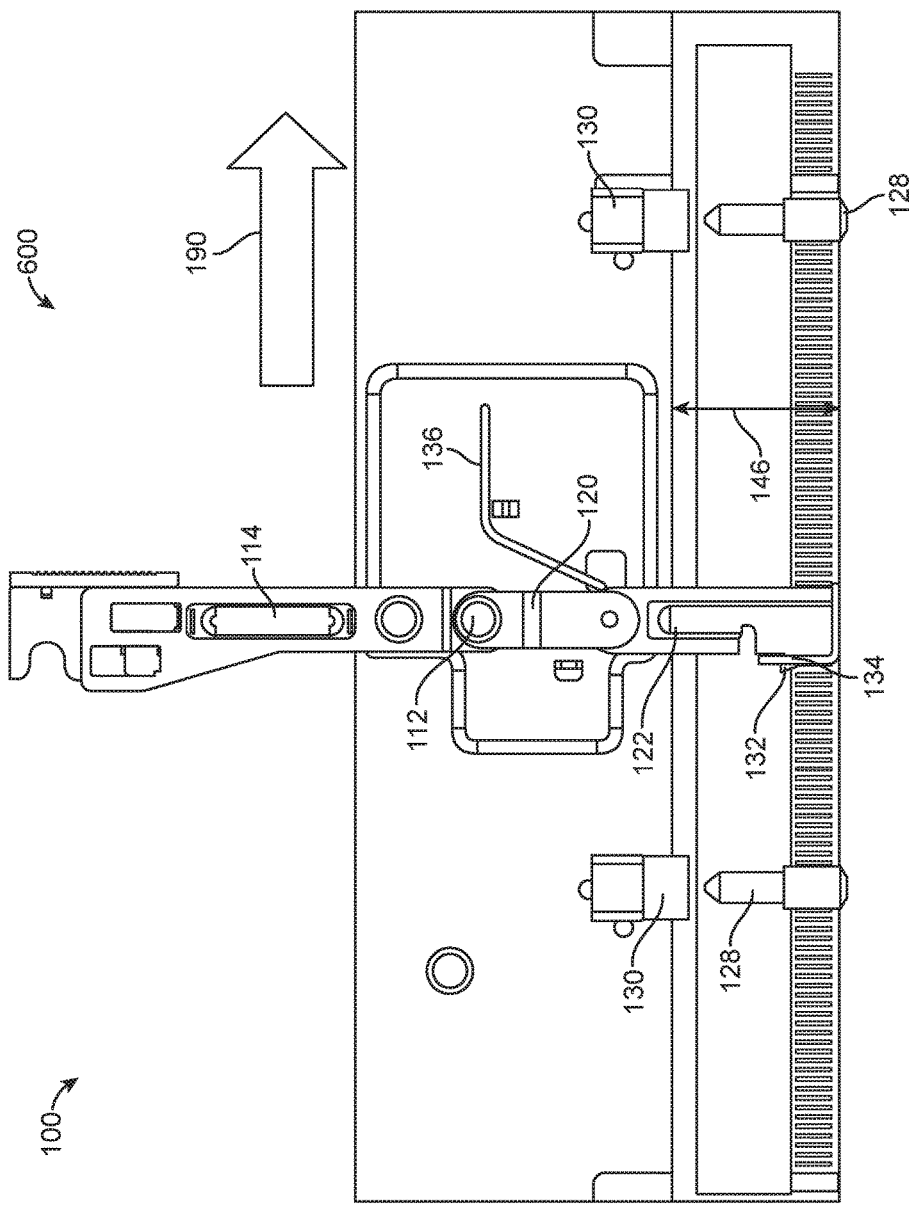
FIG. 8 is a front elevational view of an example embodiment of an assembly bracket in a deployed position coupled to a component.

FIG. 8 illustrates a side elevational view of an example embodiment of an assembly bracket in a deployed position. In the fully deployed position, the handle 114 extends beyond the perimeter of the support bracket 110 and the component 102. The support lever 122 also extends beyond the perimeter of the support bracket 110 and the component 102 in the fully deployed position. The support lever 122 extends beyond the perimeter edge nearest the latch 104 to begin engagement before coupling the component 102 and the component receiving module 106.

In the fully deployed position when the engagement member 124 and latch 104 engage, the assembly bracket 100 and component 102 are a distance 146 above the component board 108 providing clearance between the component 102 and the component receiving module 106. In at least one embodiment, the distance 146 is about 18 mm. In other embodiments, the distance 146 can be greater than or less than 18 mm depending on the arrangement of the component 102 and the component receiving module. The distance 146 must provide clearance between the component 102 and the component receiving module 106 and between the guide pins 128 and the guide pin receiving module 130.

As can be appreciated in FIG. 8, the assembly bracket is decoupled from the initial engagement between the latch 104 and the support lever 122 by translating the assembly bracket 100 in a fifth decoupling direction 190. The assembly bracket 100 and component 102 can then be removed, repaired, or replaced.

Figure 9:
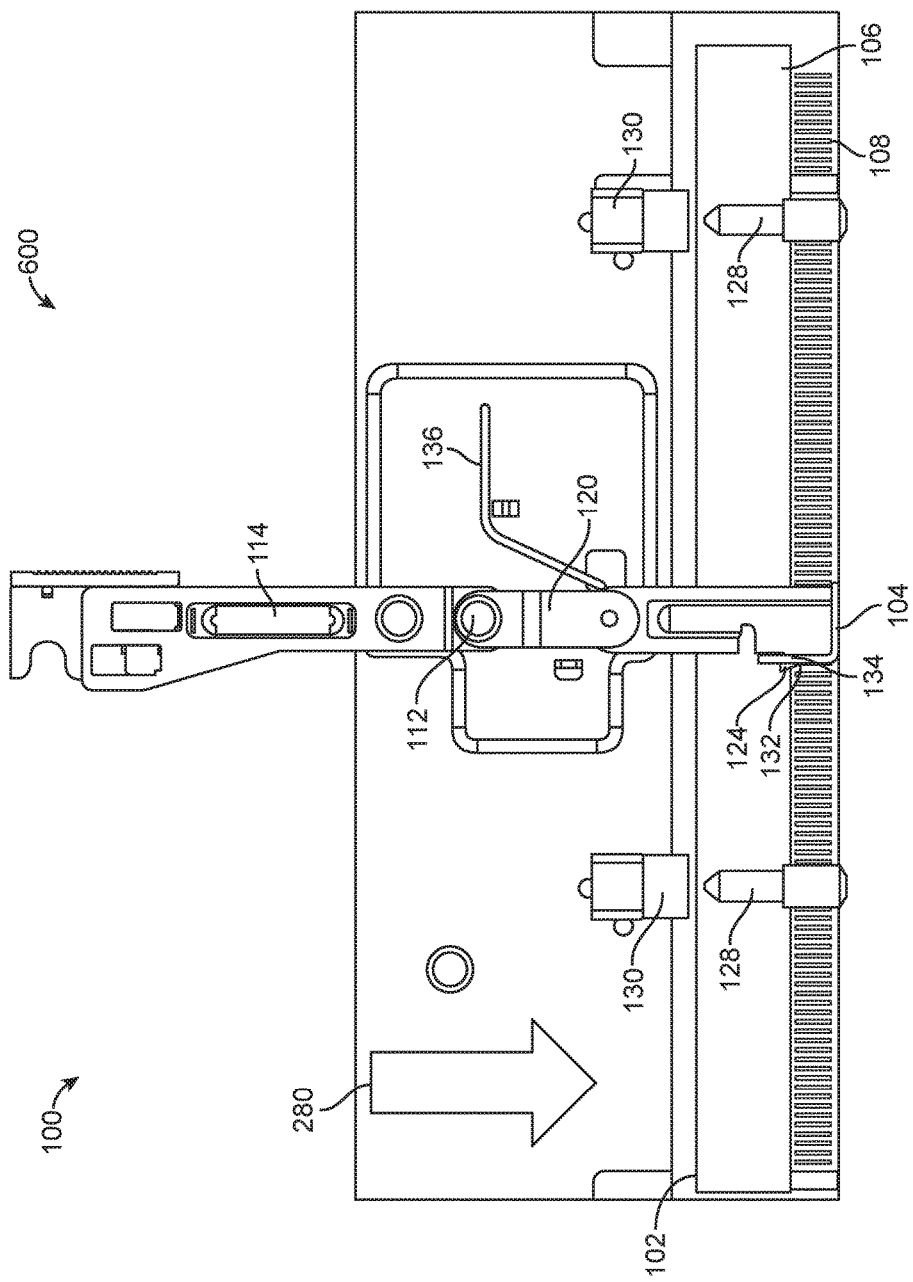
FIG. 9 is a front side elevational view of an example embodiment of an assembly bracket in a deployed position coupled to a component.
Figure 10:
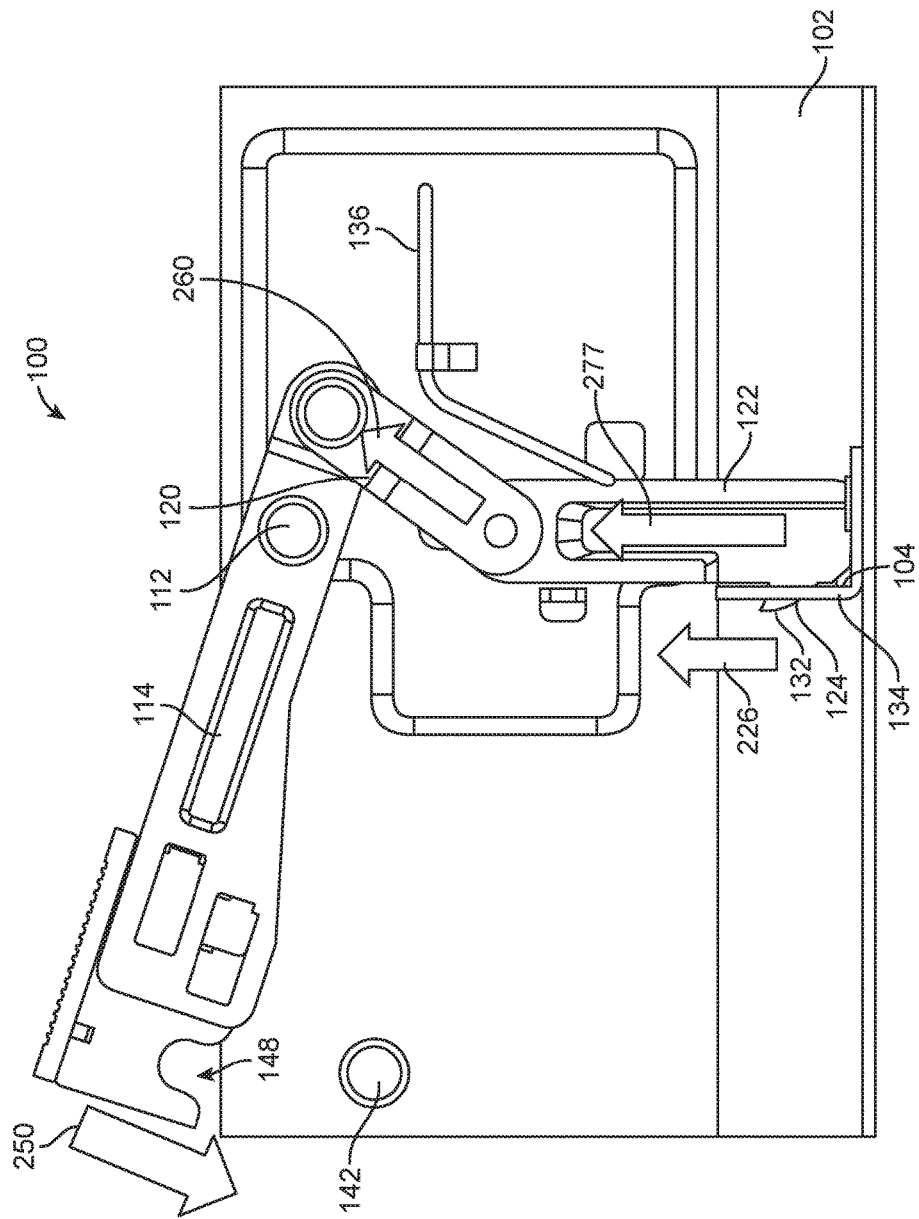
FIG. 10 is a partial side elevational view of an example embodiment of an assembly bracket in a partially deployed position.

FIG. 9 illustrates a side elevational view of an example embodiment of an assembly bracket in a deployed configuration. FIG. 10 illustrates a partial side view of an example embodiment of an assembly bracket in a partially deployed configuration. Rotation of the handle 114 in a first coupling direction 250 causes the linkage 120 to be displaced in a second coupling direction 260. The first coupling direction 250 is substantially opposite the first decoupling direction 150 and the second coupling direction 260 is substantially opposite the second decoupling direction 160. Displacement of the linkage 120 in the second coupling direction 260 displaces the support lever 122 in a third coupling direction 270. The support lever 122 is supported by a guide spring 136 to bias movement of the support lever 122 to a single axis parallel to the third coupling direction 270. Displacement of the support lever 122 generates a coupling force 226 away from the component receiving module 106 and engaging the latch 104, thereby coupling the component 102 to the component receiving module 106. As the coupling force 226 engages with and interacts against the latch 104, the assembly bracket 100 and the component 102 move in fourth coupling direction 280 toward the component receiving module 106. The fourth coupling direction 280 is substantially opposite the fourth decoupling direction 180. (See FIG. 7).

Figure 11:
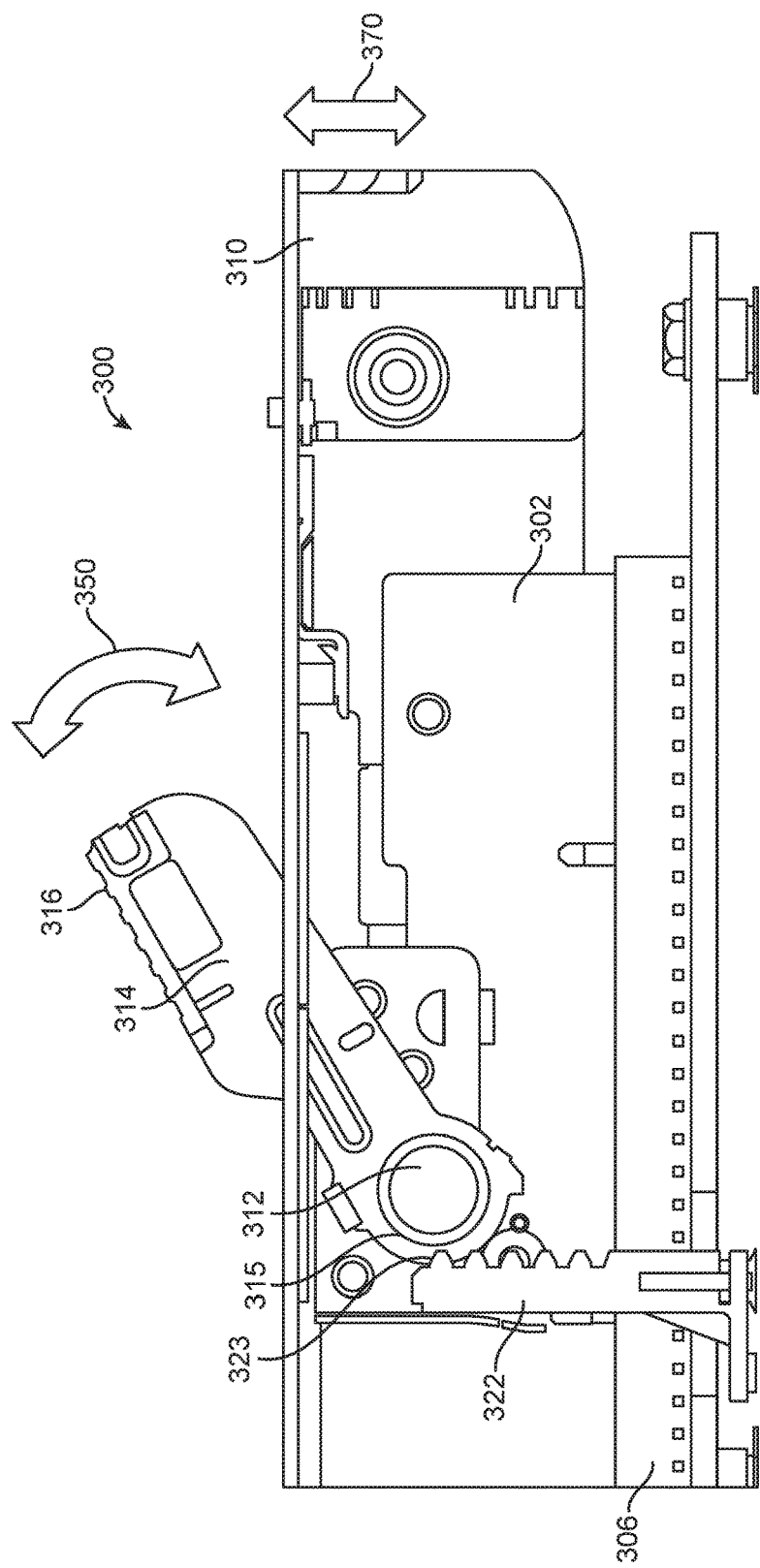
FIG. 11 is a partial side elevational view of a second example embodiment of an assembly bracket in a partially deployed position.

FIG. 11 illustrates a side elevational view of an example embodiment of an assembly bracket 300 in a partially deployed configuration. As can be appreciated in FIG. 11, a handle 314 includes a gear tooth arrangement 315 on the end opposite the gripping portion 316 configured to engage a corresponding gear arrangement 323 disposed on the support lever 322. The handle 314 can be pivoted about a rotary hinge 312 in an actuation direction 350. Actuation of the handle 314 toward the support bracket 310 draws the assembly bracket 300 and related component 302 toward a component receiving module 306. Actuation of the handle 314 away from the component 302 decouples the assembly bracket 300 and the related component 302 from the component receiving module 306.

The corresponding gear arrangement 323 are configured to engage with the handle 314 gear teeth arrangement 315 thereby actuating the support lever 322 and moving the support bracket 310 in a coupling/decoupling direction 370. Movement of the support lever 322 in a coupling direction draws the assembly bracket 300 down relative to the component receiving module 306. Movement of support lever 322 in a decoupling direction moves the assembly bracket 300 away from the component receiving module 306 thereby decoupling the component 302 from the component receiving module 306. The support lever 322 can include a guide spring to bias movement to only the coupling/decoupling direction 370. In other embodiments, the support lever 322 be coupled to the support bracket 310 by a pin received within a groove. The pin configured to travel within the groove, and the groove defining the movement of the support lever 322.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. An assembly bracket coupled to a component for locking and releasing the component with a latch of a component receiving module on a component board, the assembly bracket comprising:
   a support bracket coupled to a component; a rotary hinge coupled to the support bracket;
   a handle rotatable about the rotary hinge between a retracted position and a deployed position;
   a linkage rotatably coupled to the handle, one end of the linkage being adjacently coupled to the rotary hinge; and
   a support lever coupled to the linkage and having an engagement member to engage the latch, the support lever being adjacently coupled to the other end of the linkage;
   wherein when the handle is moved from the deployed position to the retracted position, the handle rotates about a pivot point to bring the engagement member into engagement with the latch, thereby securing the component in the component receiving module;
   wherein when the handle transitions from the retracted position to the deployed position, the support lever applies a force away from the component receiving module to thereby decouple the component from the component receiving module.

2. The assembly bracket of claim 1, wherein the component is aligned with the component receiving module by at least one guide pin received in at least one guide pin receiver.

3. The assembly bracket of claim 1, wherein the engagement mechanism is a hook and the latch has at least a partially looped shaped, the hook configured to be selectively engaged in the partially looped shape.

4. The assembly of bracket claim 1, wherein the support lever has a guide spring to guide the support lever to move along a single axis when transitioning between the latched position and the unlatched position.

5. The assembly bracket of claim 1, wherein the linkage is a gear teeth arrangement coupled with the handle and configured to couple the handle with a corresponding gear teeth arrangement on the support lever.

6. The assembly bracket of claim 1, wherein the transition from the deployed position to a retracted position causes the support lever to rotate via the linkage thereby disengaging the engagement member from the latch.

7. The assembly bracket of claim 1, wherein the assembly bracket includes a pin to secure the handle in the retracted position.

8. The assembly bracket of claim 7, wherein the handle comprises two pieces, a gripping portion and an actuation portion, the gripping portion having a textured surface capable of translating along a longitudinal axis of the handle.

9. An assembly bracket comprising:
   a support bracket configured to be coupled to a component;
   a rotary hinge connected to the support bracket;
   a handle rotatable about the rotary hinge between a retracted position and a deployed position;
   a linkage rotatably coupled to the handle, one end of the linkage being adjacently coupled to the rotary hinge; and
   a support lever coupled to the linkage and having an engagement member to engage the latch, the support lever being adjacently coupled to the other end of the linkage;
   wherein when the handle is moved from the deployed position to the retracted position, the handle rotates about a pivot point to bring the engagement member into engagement with the latch, thereby securing the component in the component receiving module;
   wherein when the handle transitions from the retracted position to the deployed position, the support lever applies a force away from the component receiving module to thereby decouple the component from the component receiving module.

10. The assembly bracket of claim 9, wherein the component is aligned with the component receiving module by at least one guide pin received in at least one guide pin receiver.

11. The assembly bracket of claim 9, wherein the engagement mechanism is a hook and the latch has at least a partially looped shaped, the hook configured to be selectively engaged in the partially looped shape.

12. The assembly of bracket claim 9, wherein the support lever has a guide spring to guide the support lever to move along a single axis when transitioning between the latched position and the unlatched position.

13. The assembly bracket of claim 9, wherein the linkage is at least one gear coupling the handle and the support lever.

14. The assembly bracket of claim 9, wherein the transition from the deployed position to a retracted position causes the support lever to rotate via the linkage thereby disengaging the engagement member from the latch.

15. The assembly bracket of claim 9, wherein the assembly bracket includes a pin to secure the handle in the retracted position.

16. The assembly bracket of claim 15, wherein the handle comprises two pieces, a gripping portion and an actuation portion, the gripping portion having a textured surface capable of translating along a longitudinal axis of the handle.

* * * * *